United States Patent [19]

Crowder et al.

[11] 4,180,596
[45] Dec. 25, 1979

[54] METHOD FOR PROVIDING A METAL SILICIDE LAYER ON A SUBSTRATE

[75] Inventors: Billy L. Crowder, Putnam Valley; Stanley Zirinsky, Bronx, both of N.Y.

[73] Assignee: International Business Machines Corporation, Armonk, N.Y.

[21] Appl. No.: 811,914

[22] Filed: Jun. 30, 1977

[51] Int. Cl.² ...................... C23C 11/08; C23C 11/00
[52] U.S. Cl. .......................................... 427/42; 427/82; 427/93; 427/99; 427/124; 427/125; 427/126; 427/248 A; 427/248 B; 427/255; 427/383 A
[58] Field of Search ...................... 427/93, 82, 99, 125, 427/126, 248 A, 248 B, 255, 42, 124, 383 A; 423/344

[56] References Cited

U.S. PATENT DOCUMENTS

| | | | |
|---|---|---|---|
| 2,982,619 | 5/1961 | Long | 423/344 |
| 3,000,071 | 9/1961 | Wehrmann | 423/344 |
| 3,381,182 | 4/1968 | Thornton | 35./40 |
| 3,540,920 | 11/1970 | Wakefield | 427/248 B |
| 3,549,416 | 12/1970 | Rump | 427/62 |
| 3,576,670 | 4/1971 | Hammond | 427/250 |
| 3,927,225 | 12/1975 | Cordes | 427/93 |
| 3,968,272 | 7/1976 | Anard | 427/84 |
| 3,979,500 | 9/1976 | Sheppard | 423/344 |

OTHER PUBLICATIONS

Aronsson, Prep. of Boride, Silicides & Phosphides, pp. 3-7 (1965).

*Primary Examiner*—Michael F. Esposito
*Attorney, Agent, or Firm*—Pollock, Vande Sande & Priddy

[57] ABSTRACT

A method for providing on a substrate a layer of a metal silicide such as molybdenum silicide and/or tantalum silicide and/or tungsten silicide and/or rhodium silicide which includes coevaporating silicon and the respective metal onto a substrate, and then heat treating the substrate to form the metal silicide.

23 Claims, 9 Drawing Figures

OXIDATION GROWTH AND RANGE OF ELECTRICAL
SHEET RESISTANCE FOR REMAINING WSi$_2$ FILM

OXIDATION GROWTH AND RANGE OF ELECTRICAL SHEET RESISTANCE FOR REMAINING $WSi_2$ FILM.

METHOD FOR PROVIDING A METAL SILICIDE LAYER ON A SUBSTRATE

FIELD OF INVENTION

The present invention is concerned with providing a layer of certain metal silicides such as molybdenum silicide, tantalum silicide, rhodium silicide, and tungsten silicide on a substrate. The method of the present invention is particularly advantageous for providing metal silicide layers on semiconductive substrates such as doped silicon and doped polycrystalline silicon.

BACKGROUND OF THE INVENTION

Polycrystalline silicon has in recent years been used to a great extent as the interconnection material in integrated circuits. Polycrystalline silicon is desirable since it is very stable at high temperatures and since silicon dioxide can be chemically vapor deposited or thermally grown thereon. Polycrystalline silicon interconnections have been used in many types of integrated circuit applications such as charge-coupled device arrays, logic arrays, and one-device memory cell arrays.

An undesirable feature of polycrystalline silicon is its relatively high electrical resistance. Attempts to improve the performance of various integrated circuits by scaling down the device dimensions have not been entirely successful since the IR drops in the interconnections do not scale down while the voltage levels appropriate for operation are reduced. Therefore, it would be desirable to decrease the sheet resistance of the polycrystalline silicon interconnections in order to gain increased circuit speed.

It has been suggested that various refractory metals such as molybdenum and tungsten could be used in place of the polycrystalline silicon. However, these metals oxidize during chemical vapor deposition of the silicon dioxide, and since these oxides are much less stable than silicon dioxide, they pose a reliability problem with the finished integrated circuit.

In order to attempt to overcome the problem posed by employing such refractory metals alone, it has been suggested to replace some portion of the polycrystalline silicon layer with a layer of a silicide of certain metals. For instance, Rideout in IBM Technical Disclosure Bulletin, Volume 17, No. 6, November 1974, Reducing the Sheet Resistance of Polysilicon Lines in Integrated Circuits, pages 1831-33 suggested the use of hafnium silicide obtained by depositing hafnium on top of polycrystalline silicon and then heating to react the hafnium and polycrystalline silicon. In addition, Rideout suggested that other candidates for such purpose included, among others, tantalum silicide, tungsten silicide, and molybdenum silicide. Rideout further suggests that the lines can then be covered with chemically vapor deposited oxide.

It was also suggested in U.S. Pat. No. 3,381,182 to Thornton to form molybdenum silicide over polycrystalline silicon by methods similar to that disclosed by Rideout or by chemical vapor deposition through hydrogen reduction of molybdenum chloride and silane. Further discussions of forming various silicides including tungsten silicide by sputtering tungsten onto a silicon containing substrate and then heating to cause formation of the silicide can be found in French Pat. No. 2,250,198 and in Journal Electrochemical Society, Solid-State Science and Technology-Fabrication and Thermal Stability of W-Si Ohmic Contacts by V. Kumar, February 1975, pages 262-69.

However, the sputtering techniques suggested suffer from a number of disadvantages. In particular, the ability to accurately vary the silicide composition is quite restrictive. Also, when employing sputtering techniques, it is necessary to employ etching to remove metal from those desired areas which are not to include the silicide.

Accordingly, it is an object of the present invention to provide a method for forming silicides of certain refractory metals which is capable of accurately controlling and varying the composition of the silicide. It is a further object of the present invention to provide a process whereby the silicide can be removed from desired areas on the substrate by simple lift-off methods employing a solvent as opposed to the more complex etching procedures which require further masking.

SUMMARY OF THE INVENTION

The present invention is concerned with providing a layer of a metal silicide on a substrate. The metal is molybdenum, tantalum, tungsten, rhodium, and mixtures thereof. The metal silicide is formed by co-evaporating silicon and one of the above metals onto the desired substrate followed by heat treating the coated substrate.

In addition, silicon dioxide can be formed over the silicide layer by high temperature thermal oxidation. The ability to form sufficient thickness for integrated circuits of oxide by thermal oxidation is not apparent from prior knowledge concerning the silicides in bulk form. For instance, bulk molybdenum disilicide and tungsten disilicide are known for their excellent oxidation resistance. For example, see the Fourth International Chemical Vapor Deposition Conference, E.C.S. Mag., Boston, Mass., October 1973, Lo et al., A CVD Study of the Tungsten-Silicon System; and Engineering Properties of Selected Ceramic Materials, The American Ceramic Society, Inc., page 5.7.3-10. In particular, with respect to molybdenum disilicide, the literature results on the oxidation rate indicate that at 1050° C., an oxide of 10 μm thickness would be formed in 60 minutes based upon the amount of oxygen used in the film formation. While such a thickness would be suitable for aerospace applications, it would not be entirely satisfactory for integrated circuit applications.

DESCRIPTION OF PREFERRED EMBODIMENTS

Figure 1A:
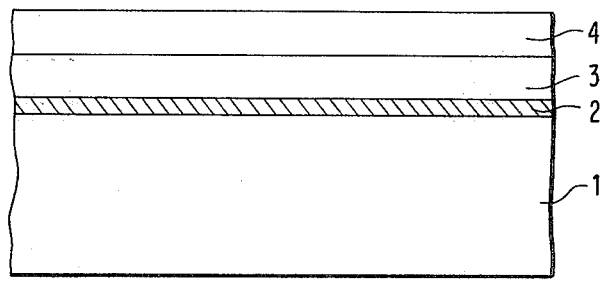
FIGS. 1A and 1B illustrate sequential cross-sectional views of one fabrication scheme for an integrated circuit employing the process of the present invention.

The process of the present invention is applicable to forming films of the desired silicide on any substrate which is capable of withstanding the high temperatures employed in the coevaporation process and which is adherent to the desired silicide. The present process is particularly advantageous in the preparation of integrated circuits and accordingly is of particular value when the substrate is silicon or polycrystalline silicon. For instance, the process of the present invention finds particular applicability in forming layers which are employed as an overlayer over doped polycrystalline silicon gate electrodes, as an alternative for polycrystalline silicon as a gate electrode material, and as an overlay directly over doped silicon diffused lines.

The metal silicides to which the present invention is directed are molybdenum silicide and/or tantalum silicide and/or tungsten silicide and/or rhodium silicide. The preferred metals of the silicides include molybdenum, tantalum, and tungsten and the most preferred silicides are the tungsten silicides. The metal silicide films generally contain from about 60 to about 25 atomic percent of the metal and correspondingly from about 75 to about 40 atomic percent of the silicon.

According to the present invention, the metal and silicon are vaporized under high vacuum and codeposited on the substrate. The vacuum employed is of the order of about $10^{-5}$ to $10^{-7}$ torr (millimeters of mercury). In the vacuum evaporation method, the metal and the silicon are heated in a high vacuum to a temperature sufficient to cause evaporation thereof. A preferred method of heating is by electron-beam evaporator and preferably employing a separate electron-beam gun for the silicon and for the metal due to the difference in evaporation rates of the materials. Use of electron-beam evaporator involves utilizing as a heat source, the heat dissipated when a highly collimated beam of electron impinges in the material. The apparatus and conditions for evaporating silicon and the metal are known and need not be described herein in any further detail. It is preferred that the rate of evaporation of the metal and silicon be between about 25 and about 50 angstroms per second. The substrate to be coated is usually maintained at a temperature between about room temperature and about 400° C. and preferably between about 150° C. and 250° C. during the coating of the metal and silicon thereon.

After the desired amount of metal and silicon are deposited onto the substrate, the substrate is removed from the vacuum evaporation equipment and then subjected to a high temperature heat treatment. The coated substrate is heated in an inert atmosphere at temperatures from about 700° to about 1100° C. and preferably from about 900° to about 1100° C. The maximum temperature suitable is dependent primarily upon practical considerations and particularly is selected so as to avoid excessive grain growth in the silicide layer. Suitable inert atmospheres under which the heat treatment can be conducted include argon, helium, and hydrogen.

The inert atmosphere should be free of water vapor, oxygen, carbon compounds, nitrogen, and other substances which would cause the formation of carbides, oxides, or nitrides with the metal during the heating.

The coated substrate is heated at the above temperatures for a time sufficient to react the deposited metal and deposited silicon to form the desired silicide and is usually between about 15 minutes and 2 hours. The time required for the heating is inversely related to the temperature employed.

After the heat treatment, the coated substrate can, if desired, be subjected to oxidation to thereby provide a self-passivating oxide layer over the silicide layer. It has been noted that any loss in the conductivity of the silicide layer due to the oxidation is much less than would be expected from the percentage of the layer oxidized. In other words, oxidation of 50% of the layer does not result in a correspondingly 50% decrease in the conductivity of the layer. It is believed that this result may be due to the preferential oxidation of primarily the silicon in the silicide layer and back diffusion of the metal thereby resulting in a metal enriched silicide layer beneath the oxidized layer. For a discussion of some prior work of interest on the oxidation of molybdenum silicide, see J. Berkowitz—Matluck et al., "High Temperature Oxidation II. Molybdenum Silicide," J. Electrochemical Soc., Vol. 112, No. 6, page 583, June 1965.

Figure 3A:
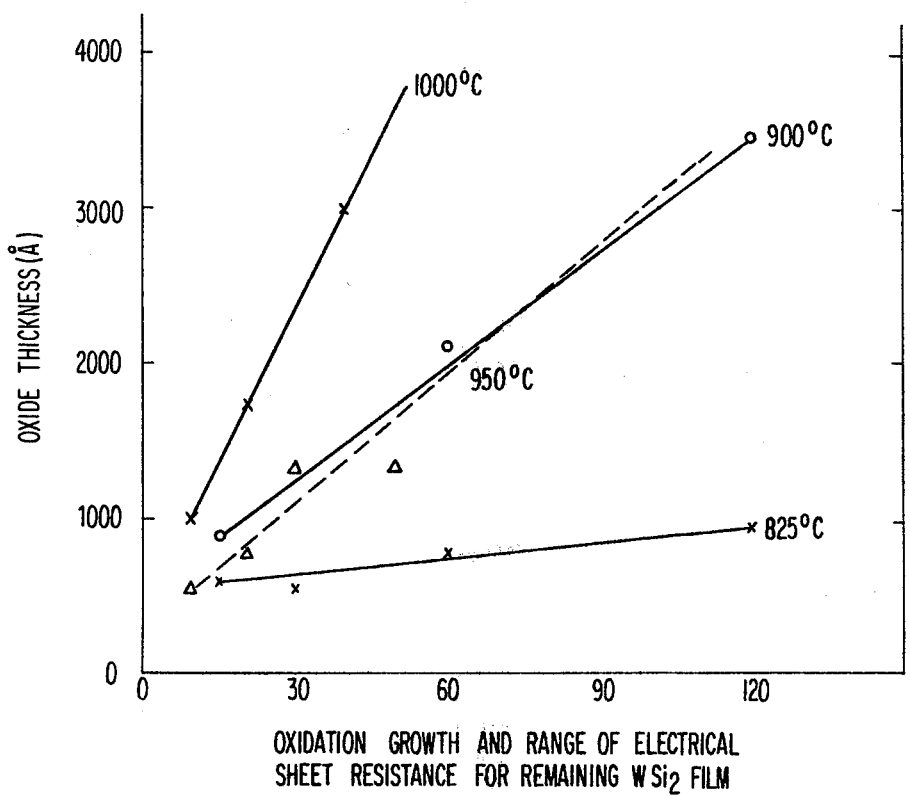
FIGS. 3A and 4A illustrate the relationship between temperature and time of oxidation and thickness of oxide layer for $WSi_2$.
Figure 3B:
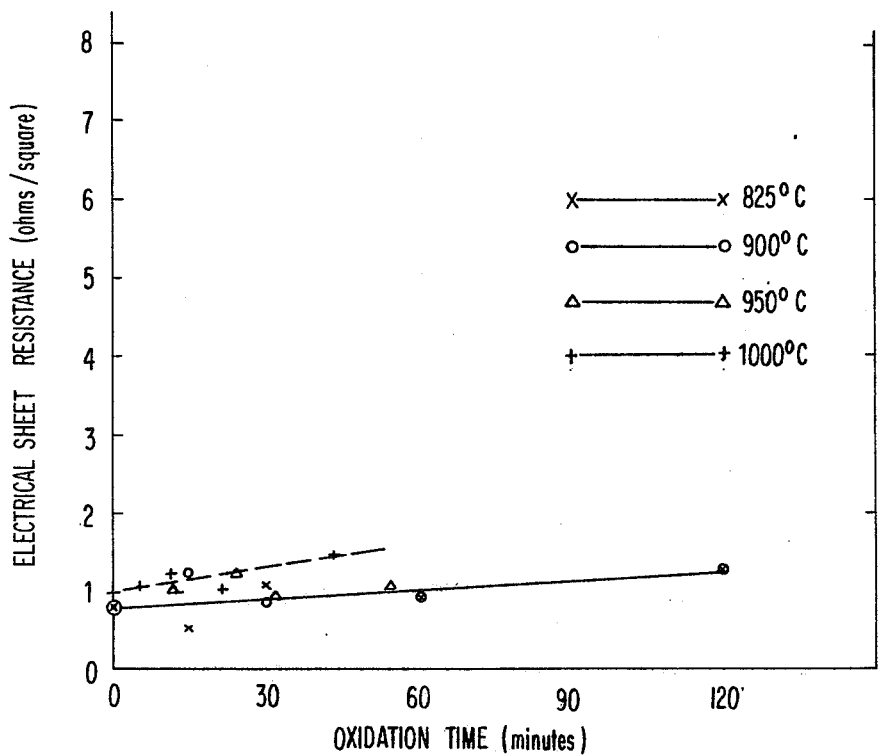
FIGS. 3B and 4B illustrate the relationship between oxidation temperature and time, and sheet resistance for $MoSi_2$.
Figure 4A:
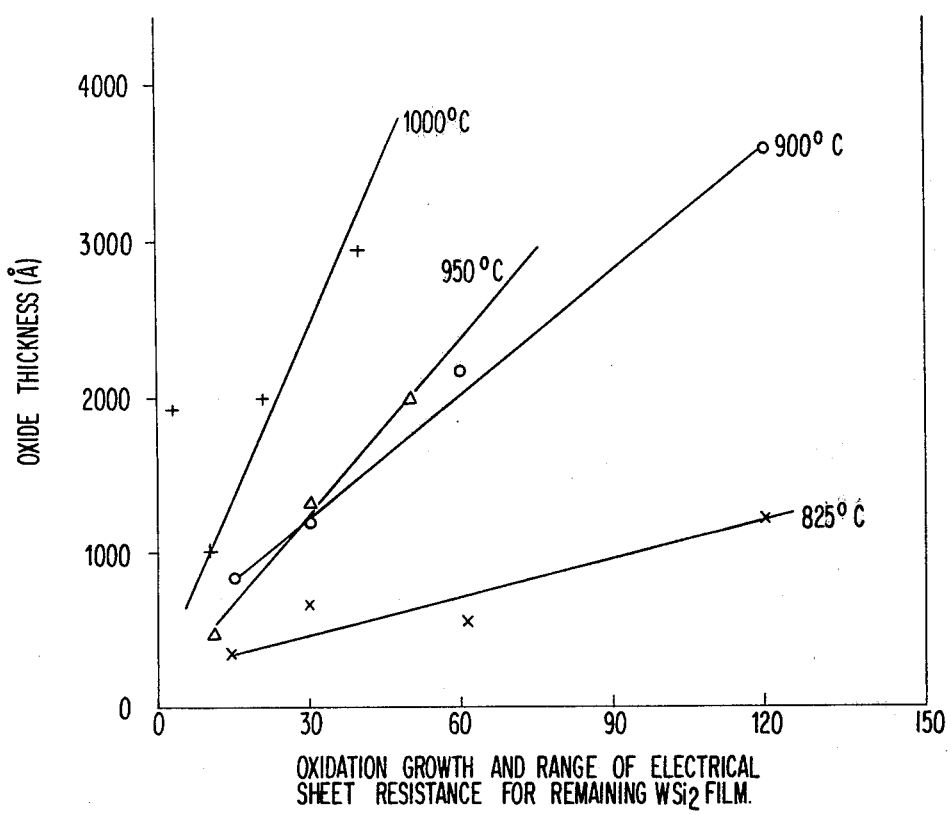
Figure 4B:
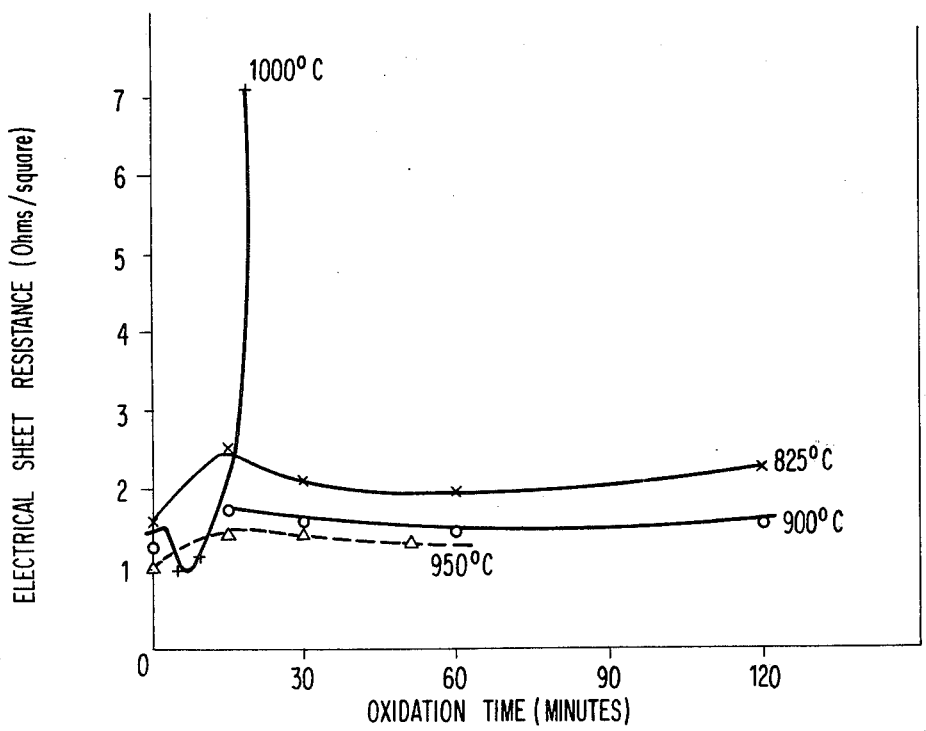

FIGS. 3B and 4B illustrate the change in resistivity of some oxidized silicides at various temperatures. The overall results indicate about a 30% improvement in the conductivity as compared to expected conductivity based on the percentage oxidized. The oxidation of the molybdenum silicide at 1000° C. for over 15 minutes was detrimental to the film and changed its properties. Therefore, such conditions for molybdenum silicide should be avoided to maintain high conductivity. The oxidation was conducted in steam under the conditions specified.

The preferred method of oxidation is steam oxidation (or a dry-wet-dry oxidation) since such results in better electrical breakdown properties as compared to the use of other means of oxidation. The preferred temperatures employed in the steam oxidation are from about 800° to about 1100° C. at about atmosphere pressure. The time employed for the oxidation depends upon the desired thickness of the oxide and generally takes between about 15 minutes and about 2 hours. For instance, 1000–3000 angstroms thickness take about 2 hours at about 800° C. and about 30 minutes at about 950° C.

FIGS. 3A and 4A illustrate the growth of the insulating oxide over the silicide during exposure to steam at the indicated temperatures and times.

Table I below represents resistance measurements obtained for silicide films prepared according to the present invention using electron beam evaporation. The films were deposited on silicon substrate to about $0.5\mu$ thickness.

Table I

Silicide Resistance as Function of Composition and Heat Treatment (Electron Beam Deposition) ($0.5\mu$ films)

| Composition | | Bulk Resistance (microohms centimeters) (from the Literature) | As deposited prior to heat treatment | |
|---|---|---|---|---|
| | | | Bulk Resistance (microohms centimeters) | Sheet Resistance (ohms/square) |
| W-Si | | | | |
| % W | Composition | | | |
| 92 | W$_5$Si$_3$ | 30 | 210 | 4.2 |
| 76.5 | WSi$_2$ | 33 | 370 | 7.4 |
| 62 | WSi$_2$+Si | — | 150 | 30 |
| Ta-Si | | | | |
| % Ta | Composition | | | |
| 92 | Ta$_5$Si$_3$ | 8 | 300 | 6.0 |
| 76 | TaSi$_2$ | 8.5 | 372 | 7.5 |
| 62 | TaSi$_2$+Si | — | 900 | 18.0 |
| Ni-Si | | | | |
| % Mo | Composition | | | |
| 85 | Mo$_5$Si$_3$ | 18 | 250 | 5.0 |
| 63 | MoSi$_2$ | 22 | 325 | 6.5 |
| 50 | MoSi$_2$+Si | — | 800 | 16.0 |
| Rh-Si | | | | |
| % Rh | Composition | | | |

Table I-continued
Silicide Resistance as Function of Composition and
Heat Treatment (Electron Beam Deposition) (0.5μ films)

| | | | |
|---|---|---|---|
| 78.7 | RhSi | 155* | 175 | 3.5 |

Heat Treated (1000° C. - 20 min. H₂)
Oxidized Si Substrate

| Composition | | Bulk Resistance (microohm centimeters) | Sheet Resistance (ohms/square) |
|---|---|---|---|
| W-Si | | | |
| % W | Composition | | |
| 92 | W₅Si₃ | 55 | 1.09 |
| 76.5 | WSi₂ | 54 | 1.07 |
| 62 | WSi₂+Si | 86 | 1.72 |
| Ta-Si | | | |
| Ta | Composition | | |
| 92 | Ta₅Si₃ | 72.5 | 1.45 |
| 76 | TaSi₂ | 79 | 1.58 |
| 62 | TaSi₂+Si | 166 | 8.3 |
| Mo-Si | | | |
| % Mo | Composition | | |
| 85 | Mo₅Si₃ | 60 | 1.2 |
| 63 | MoSi₂ | 70 | 1.4 |
| 50 | MoSi₂+Si | 159 | 3.0 |
| Rh-Si | | | |
| % Rh | Composition | | |
| 78.7 | RhSi | 77.5 | 1.55 |

*Interdiffused film (Petersson, Phys. Stat. Sol (a) 36, 217 (1976)

Table II below demonstrates the improved conductivity of the silicide obtained by the method of the present invention as compared to doped silicon. The improved conductivity is important for improving signal transmission speed on a circuit transmission line.

Table II
Sheet Resistances for Device Processing Runs

| | Silicide Lines (tungsten silicide) (ohms/square) | Diffused Lines (phosphorus doped silicon) (ohms/square) |
|---|---|---|
| FET Simulation Sample 1 | 2.0 ± .1 | — |
| FET Sample 2 | 2.87 ± .04 | 19.7 ± .4 |
| Sample 3 | 2.73 ± .10 | 20.3 ± 2 |

4-point probe test sites.

- 20 to 90 sites tested.- gate. (flatband). doping. thickness. V$_{trigger}$. field.

wafer. surface doping) measurements.

Table III below illustrates that the use of the metal silicide obtained by the method of the present invention is at least as good as polycrystalline based upon flatband voltage and electrical breakdown voltage for the oxide over the silicide. The flatband voltage is one of the parameters directly related to the gate control voltage necessary to turn on the FET device and its specification within a narrow range is important to the operation of FETs for integrated circuit applications.

Table III
Summary of Capacitor Data (254 micrometers)²

| | V$_{fb}$(volts) | N$_{avg}$(cm⁻³) | t$_{ox}$(A) | V$_{bd}$ (volts) | E$_{bf}$(M volts/ cm) |
|---|---|---|---|---|---|
| FET Simulation Sample 1 - MoSi₂ | −1.11±.04 | — | 323 | — | — |
| FET Sample 2 - WSi₂ | −1.07±.03 | 1.5×10¹⁶ | 376 | 26±8 | 7 |
| Sample 3 - WSi₂ | −1.1±.1 | 1.6×10¹⁶ | 375 | 32±7 | 8.6 |
| Sample 4 - WSi₂ | — | — | 370 | 29±7 | 7.8 |
| Sample 5 (Control) | −1.1* | — | 375 | 16.5±14 | 4.4 |

*Predicted for polysilicon FET control gate.
V$_{fb}$ is Voltage (flatband).
N$_{avg}$ is Average surface doping.
t$_{ox}$ is Gate oxide thickness.
v$_{bd}$ is Breakdown voltage for Gate oxide (is an average value for 100 capacitors - 20 V/sec. 1 microamp trigger).
E$_{bf}$is Electrical breakdown field.
Results other than V$_{bd}$ are for 20 to 90 sites on each wafer.
V$_{fb}$ and N$_{avg}$ (average surface doping) determined from CV profile measurements.
M volts is volts time 10⁶

Furthermore, it was observed that the average breakdown field for self oxidized silicide of about 3000 angstroms spaced between an aluminum conductor and the silicide layer was greater than 2-3 MV/cm.

Figure 1B:
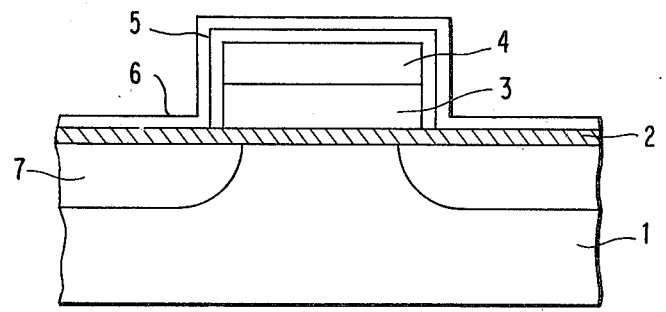

Reference to FIGS. 1A and 1B illustrates one use of the present invention in integrated circuits (e.g., the formation of a composite gate of polycrystalline silicon and the metal silicide).

For convenience, the discussion of the fabrication steps is directed to employing a p-type silicon substrate as the semiconductive substrate and n-type impurities as the diffused or implanted dopant impurities. This leads to the n-channel FET technology. Accordingly, it is understood that an n-type substrate and p-type diffused or implanted dopant impurities can be employed according to the present invention in the p-channel FET technology.

It is understood that when the discussion refers to n-type impurities, the process steps are applicable to p-type impurities and vice versa. Also, the present invention is applicable to substrates other than silicon which are known in the art. Also, as used herein, the terms "metallic type interconnection lines" and "high-conductivity interconnection lines" refer to metal lines such as aluminum as well as to nonmetallic materials which nevertheless can have conductivities of the magnitude generally possessed by conductive metals.

Also, when reference is made to impurities of a "first type" and to impurities of the "second type," it is understood that the "first type" refers to n or p-type impurities and "second type" refers to the opposite conductivity type. That is, if the "first type" is p, then the "second type" is n. If the "first type" is n, then the "second type" is p.

Referring to FIG. 1A, there is shown a fragment of a structure. A p-type silicon substrate 1 having any desired crystal orientation (e.g., <100>) can be prepared by slicing and polishing a p-type silicon boule grown in the presence of a p-type dopant such as boron following conventional crystal growth techniques. Other p-type dopants for silicon include aluminum, gallium, and indium.

A thin gate insulator layer of silicon dioxide 2 is grown on or deposited onto the silicon substrate 1. This gate insulator, which is usually about 200 to 1000 angstroms thick, is preferably formed by thermal oxidation of the silicon surface at 1000° C. in the presence of dry oxygen.

A layer of polycrystalline silicon 3 is then deposited. The polysilicon layer is usually approximately 500 to 2000 angstroms thick, and may be formed by chemical-vapor deposition. The polysilicon layer is now doped with an n-type dopant such as arsenic, phosphorus, or antimony by one of several conventional techniques. For example, the polysilicon is doped with phosphorus using the technique of depositing a POCl$_3$ layer and heating it to approximately 1000° C. to drive the phosphorus into the polysilicon making it n-type. After this, the residual of the POCl$_3$ layer is removed by etching the wafer in buffered hydrofluoric acid. Next a silicide layer 4 of about 2000–4000 angstroms thick is formed on the polycrystalline silicon by the coevaporation and heating procedure of the present invention as disclosed hereinabove.

A gate pattern can be fabricated by employing one of the several well known procedures: e.g., chemical etching, plasma etching, reactive ion etching, etc. The process details vary with the technique employed, but the final result is similar; namely, a patterned layer of silicide/polysilicon. If chemical etching is employed, we have found that hot H$_3$PO$_4$ will selectively etch silicides relative to polycrystalline silicon or SiO$_2$. The preferred technique is to etch the silicides by a "dry" technique such as reactive ion etching employing species such as CF$_4$.

The n-type source and drain regions are now formed by well-known ion implantation or diffusion techniques. For instance, the n-type source and drain regions 7 and 8, respectively, can be formed 2000 angstroms deep by an As$^{75}$ implant of about 100 KeV energy and $4\times10^{15}$ atoms/cm$^2$ dose. During implantation, the polysilicon gate 3 and silicide layer 4 act as a blocking mask to prevent n-type dopant impurities from entering the FET channel region under the polysilicon gate 3.

The boundaries between the n-type source and drain regions and the channel of the FET are determined by the polysilicon gate. This is generally referred to in the prior art as the "self-aligned gate technique."

Next, a self passivating silicon dioxide layer 5 is formed on the gate regions by the oxidation procedures discussed hereinabove. For instance, the structure is subjected to steam oxidation at about 950° C. for about 30 minutes to provide an oxide thickness of between about 1000 and 3000 angstroms.

This is followed by a CVD silicon dioxide layer of between about 1000 and about 1500 angstroms thick to prevent subsequently applied metallic interconnection such as aluminum from interreacting with the silicide layer. The oxide layers and metallic layers are defined by conventional masking and etching techniques. For instance, the silicon dioxide can be removed employing buffered HF whereas the aluminum can be etched with mixtures of phosphoric and nitric acids. The aluminum may be deposited by sputtering or evaporation.

Figure 2A:
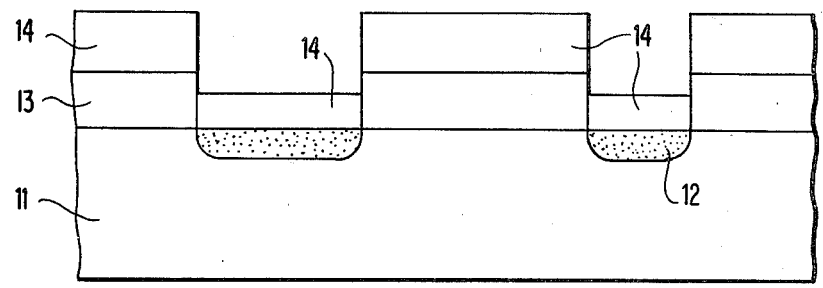
FIGS. 2A-2C illustrate sequential cross-sectional views of another fabrication scheme for an integrated circuit employing the process of the present invention.
Figure 2B:
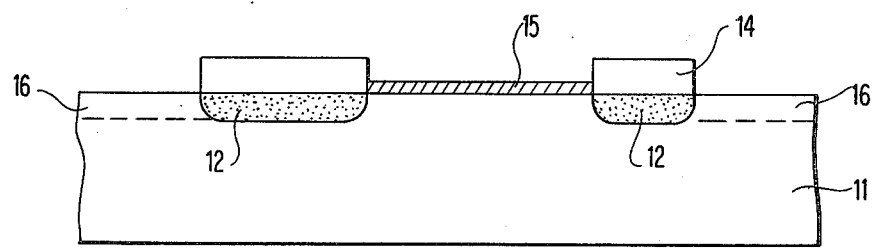
Figure 2C:
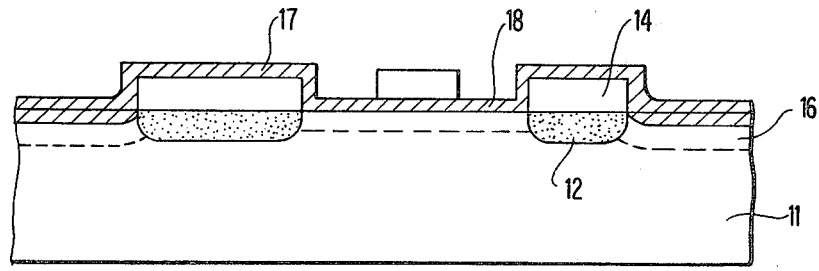

Reference to FIGS. 2A–2C demonstrates another scheme for employing the present invention in fabricating integrated circuits. The following technique is made advantageous in view of the ability of the coevaporated silicide to be removed from predetermined portions of the substrate by lift-off methods.

The substrate 11 is coated with a layer of material 13 which provides a suitable lift-off geometry. In the simplest case, the layer 13 is a resist material in which the pattern desired is generated by conventional techniques (e.g., PMMA with electron beam lithography). It should be noted that layer 13 might be a multiple layer stack of materials patterned by employing resist layers and etching procedures in order to achieve a lift-off geometry with materials capable of withstanding moderately high temperature processing environments.

After the lift-off layer 13 is patterned, the substrate is then doped in those regions unprotected by the lift-off mask to form an n-type region 12. Techniques such as ion implantation of As, P, or Sb can be used to provide doping in this region.

A layer 14 of coevaporated metal and silicon is applied to the substrate by the coevaporation step discussed hereinabove. The coevaporated layer 14 is not interconnected between the portions which are above the lift-off material and those portions which are not as would occur in a sputtering technique. Sputtering results in some coating of the edges which could cause such interconnection. Accordingly, the lift-off material and that material above it can be readily removed by a simple lift-off procedure with solvent for the resist material such as acetone.

The structure is then subjected to heat treatment at temperatures from about 700° to about 1100° C. in an inert atmosphere such as argon, hydrogen, or helium as required by the present invention to form the silicide. Next, the silicide layer 14 can be subjected to oxidation to provide a self passivating oxide layer on the silicide layer.

An oxidation barrier mask 15 such as a layer of silicon nitride over a layer of silicon dioxide is provided over the portion of the substrate which is subsequently to be the device area.

Doping impurities 16 such as boron can be provided in the field area by ion implantation techniques. Silicon dioxide is then grown such as by CVD over those portions of the substrate not protected by the silicon nitride oxidation barrier layers.

The oxidation barrier layer material is considered to be a nonoxidized material under the conditions to which it is subjected in the method of the present invention. The oxidation barrier layer prevents oxidation of the silicon thereunder.

The oxidation barrier layer is then stripped by employing a suitable solvent. For example, when silicon nitride is employed, it can be etched in a phosphoric acid solution at 180° C. Silicon dioxide can be etched in a solution of buffered hydrofluoric acid.

A gate insulating layer 18 of silicon dioxide is then grown on the substrate. Doping for the channel region is provided by ion implantation. This is followed by depositing the gate material and then delineating by known masking and etching techniques. The gate material can be provided by the coevaporation and heating of silicon and the metal, by deposition of polycrystalline silicon alone or by a combination of polycrystalline silicon followed by a layer formed by coevaporation and heating of silicon and the metal in accordance with the techniques of the present invention. Next, the source and drain dopants are provided by ion implantation. Then, self-passivating silicon dioxide layer 17 is provided by steam oxidation of the type discussed hereinabove. This is followed by another CVD layer 18 of silicon dioxide.

What is claimed is:

1. A method for preparing metal silicide interconnections in an integrated circuit which comprises providing a layer of a metal silicide on a substrate wherein said metal is selected from the group consisting of molybdenum, tantalum, tungsten, rhodium, and mixtures thereof, by coevaporating said metal and silicon onto the desired substrate and then heat treating the coated substrate for a time sufficient for reacting deposited metal and deposited silicon to thereby obtain said metal silicide interconnections and wherein said interconnections are provided on the same side of the substrate as are electrically active devices.

2. The method of claim 1 wherein said substrate is polycrystalline silicon.

3. The method of claim 1 wherein said substrate is silicon.

4. The method of claim 1 wherein said metal is selected from the group consisting of molybdenum, tantalum, and tungsten.

5. The method of claim 1 wherein said metal is molybdenum.

6. The method of claim 1 wherein said metal is tantalum.

7. The method of claim 1 wherein said metal is tungsten.

8. The method of claim 1 which includes heat treating the coated substrate at a temperature from about 700° to about 1100° C. in an inert atmosphere.

9. The method of claim 8 wherein said inert atmosphere is hydrogen, argon, helium, or mixtures thereof.

10. The method of claim 1 which further includes oxidation of a portion of the silicide layer.

11. The method of claim 10 wherein said oxidation is dry-wet-dry oxidation.

12. The method of claim 10 wherein said oxidation is dry-wet-dry oxidation conducted at a temperature between about 800° and about 1100° C. for about 15 minutes to about 1 hour.

13. The method of claim 1 wherein said coevaporation is conducted under high vacuum employing electron-beam as the heat-source.

14. The method of claim 1 wherein the silicide layer includes an excess of free silicon.

15. The method of claim 1 wherein said silicide includes from about 60 to about 25 atomic percent of said metal and correspondingly from about 75 to about 40 atomic percent of silicon.

16. The method of claim 1 wherein the rate of evaporation of said metal and said silicon is between about 25 and about 50 angstroms per second.

17. The method of claim 1 wherein the temperature of said substrate during coating is between about room temperature and about 400° C.

18. The method of claim 1 wherein the temperature of said substrate during coating is between about 150° C. and 250° C.

19. The method of claim 8 wherein said temperature is from about 900° to about 1100° C.

20. The method of claim 1 wherein said heat treating is conducted between about 15 minutes and 2 hours.

21. The method of claim 1 wherein the temperature of said substrate during the coating is between about room temperature and about 400° C. and which includes heat treating the coated substrate at a temperature from about 700° to about 1100° C. in an inert atmosphere.

22. The method of claim 21 where said temperature of said substrate is between about 150° C. and 250° C.

23. The method of claim 8 wherein the temperature of said substrate during coating is between about room temperature and about 400° C.

* * * * *

UNITED STATES PATENT AND TRADEMARK OFFICE
CERTIFICATE OF CORRECTION

PATENT NO. : 4,180,596
DATED : December 25, 1979
INVENTOR(S) : Crowder et al

It is certified that error appears in the above-identified patent and that said Letters Patent are hereby corrected as shown below:

Column 4, Table I, line 63, change "Ni-Si" to --Mo-Si--.

Column 5, Table I, about line 17, place a percent sign --%-- before the column heading "Ta Composition".

Column 5, in the footnote below Table I, add a parenthesis --)-- at the end of the line.

Column 5, Table II, about line 45, delete the following portion beneath the Table:

"gate. (flatband).

doping. thickness.

$V_{trigger}$). field.

wafer. surface doping) measurements."

Column 5, in the heading of Table III, change "$t_{ox}(A)$" to --$t_{ox}(Å)$--.

UNITED STATES PATENT AND TRADEMARK OFFICE
CERTIFICATE OF CORRECTION

PATENT NO. : 4,180,596

DATED : December 25, 1979

INVENTOR(S) : Crowder et al

It is certified that error appears in the above-identified patent and that said Letters Patent are hereby corrected as shown below:

Column 6, Table III, line 18, after "volts" change "time" to --times--.

Signed and Sealed this

Tenth Day of June 1980

[SEAL]

Attest:

Attesting Officer

SIDNEY A. DIAMOND

Commissioner of Patents and Trademarks